(12) United States Patent
Lewis et al.

(10) Patent No.: US 8,159,259 B1
(45) Date of Patent: Apr. 17, 2012

(54) SELF-MODIFYING FPGA FOR ANTI-TAMPER APPLICATIONS

(76) Inventors: James M. Lewis, Moulton, AL (US);
Joey R. Haddock, Decatur, AL (US);
Dane R. Walther, Madison, AL (US)

( * ) Notice: Subject to any disclaimer, the term of this patent is extended or adjusted under 35 U.S.C. 154(b) by 1248 days.

(21) Appl. No.: 11/882,803

(22) Filed: Aug. 6, 2007

(51) Int. Cl.
*H03K 19/00* (2006.01)
*G06F 12/14* (2006.01)
*G06F 13/00* (2006.01)

(52) U.S. Cl. .............................. 326/8; 713/194; 711/163

(58) Field of Classification Search .......... 326/8, 37–41, 326/47, 101; 713/193–194; 711/163–164
See application file for complete search history.

(56) References Cited

U.S. PATENT DOCUMENTS

| | | | |
|---|---|---|---|
| 5,452,355 A | 9/1995 | Coli | |
| 5,572,696 A | 11/1996 | Sonobe | |
| 5,758,121 A | 5/1998 | Fukuzumi | |
| 5,898,776 A | 4/1999 | Apland et al. | |
| 6,292,898 B1 | 9/2001 | Sutherland | |
| 6,356,637 B1 * | 3/2002 | Garnett | 380/265 |
| 6,981,153 B1 * | 12/2005 | Pang et al. | 713/194 |
| 7,020,019 B2 | 3/2006 | Salessi et al. | |
| 7,058,177 B1 | 6/2006 | Trimberger et al. | |
| 7,117,373 B1 * | 10/2006 | Trimberger et al. | 713/193 |
| 7,200,759 B2 * | 4/2007 | Oerlemans | 713/194 |
| 7,203,842 B2 * | 4/2007 | Kean | 713/189 |
| 7,240,218 B2 * | 7/2007 | Kean | 713/193 |
| 7,368,935 B2 * | 5/2008 | Bernier et al. | 326/8 |
| 7,759,968 B1 * | 7/2010 | Hussein et al. | 326/38 |
| 7,878,902 B2 * | 2/2011 | Mattice et al. | 463/29 |
| 2001/0015919 A1 * | 8/2001 | Kean | 365/200 |
| 2006/0059574 A1 | 3/2006 | Fayad et al. | |
| 2006/0225142 A1 | 10/2006 | Moon | |
| 2007/0288765 A1 * | 12/2007 | Kean | 713/193 |
| 2010/0023538 A1 * | 1/2010 | Kreiner et al. | 707/101 |
| 2010/0232600 A1 * | 9/2010 | Lewis | 380/28 |

\* cited by examiner

*Primary Examiner* — Shawki S Ismail
*Assistant Examiner* — Thienvu Tran
(74) *Attorney, Agent, or Firm* — Welsh Flaxman & Gitler LLC (57) ABSTRACT

A self-modifying FPGA system includes an FPGA and a configuration memory device coupled to the FPGA for providing the FPGA with configuration information. The configuration memory device is programmed with configuration data and dormant data. The FPGA system is also provided with a configuration assist circuit coupled to the FPGA and the configuration memory device for controlling loading of configuration information from the configuration memory device to the FPGA. A tamper detection system provides a tamper signal to the FPGA, wherein when a tamper signal is received by the FPGA the configuration data is replaced with the dormant data.

20 Claims, 5 Drawing Sheets

FPGA System for Self-Modification showing Configuration Memory Detail A, a system with Configuration Data and Null Data.

Figure 1, Block Diagram of FPGA System for Self-Modification

Figure 2, FPGA System for Self-Modification showing Configuration Memory Detail A, a system with Configuration Data and Null Data.

Figure 3, FPGA System for Self-Modification showing Configuration Memory Detail B, a system with Configuration Data and Dormant Data.

Figure 3A, FPGA System for Self-Modification showing Configuration Memory Detail B after a tamper indication and self-modification.

Figure 4, FPGA System for Self-Modification showing Configuration Memory Detail C, a system with Configuration Data and multiple Dormant Data Sets.

SELF-MODIFYING FPGA FOR ANTI-TAMPER APPLICATIONS

The U.S. Government has a paid-up license in this invention and the right in limited circumstances to require the patent owner to license others on reasonable terms as provided by the terms of contract number N 00178-06-C-3032 awarded by the Department of Defense.

BACKGROUND OF THE INVENTION

1. Field of the Invention

The present invention relates to a system for preventing tampering of electronic devices. More particularly, the invention relates to a self-modifying FPGA (field programmable gate array) for anti-tamper applications.

2. Description of the Related Art

The present invention provides a method of sanitizing secure electronic systems to eliminate access by an adversary. Sanitization is the process of completely removing all traces of information from electronic memory devices such as Programmable Read Only Memory (PROM), Electrically Erasable Programmable Read Only Memory (EEPROM), and FLASH Memory devices. For the purposes of the present application the term "PROM" is used to refer to all of these devices and is intended to imply an electrically erasable (or FLASHable) device.

In secure electronic systems, memory is often sanitized by a process of over writing with various data patterns. The sanitizing process may be as simple as writing to all memory locations with all logical zeros followed by writing to all memory locations with all logical ones. Often this process is repeated for several cycles. Finally, a test pattern or default data can be written to the memory device.

Many electronic systems are computer based. That is, these electronic systems are connected to a host computer or include a computer (in the form of a microprocessor or microcontroller) as a system controller. In these computer based systems, the computer can be programmed to take care of sanitizing memory devices if required.

Some electronic systems do not include a computer or processor. Other electronic systems may include memory in subsystems that is not accessible by processors or computer resources for the purpose of sanitizing. Often, these memories are associated with ASICs (Application Specific Integrated Circuits) or FPGAs (Field Programmable Gate Arrays). These memories may be used as processing memory to hold data that is undergoing mathematical manipulation or other processing by the FPGA or ASIC, or these memory devices may be PROMs that store configuration data for the ASIC or FPGA. The present invention deals primarily with the latter case; that is, non-volatile memories (PROMs) that contain configuration data for ASICs or FPGAs.

As those skilled in the art are well aware, FPGAs are integrated circuit devices that can be programmed in the field after manufacture. FPGAs are similar to, but have wider applications than, PROM chips. FPGAs are commonly used by engineers in the design of specialized integrated circuits that can later be produced hard-wired in large quantities for distribution to computer manufacturers and end users.

Electronic systems and sub-systems that are FPGA based are becoming more common. Image and audio processing are greatly accelerated by using FPGA resources for Digital Signal Processing, compared to using a microprocessor. FPGAs can process large arrays of data in parallel and specialized functions such as Fast Fourier Transforms (FFT), digital filtering, and image compression can be performed with orders of magnitude speed improvements over processors.

FPGAs are attractive design options because their functionality can be modified, upgraded, or completely changed, hence, the "field programmable" portion of their name. Each time an SRAM (static random access memory) FPGA is powered, the FPGA reads configuration information from an accompanying memory device (for example, the PROM). This configuration information is used to specify the operation of the digital gates, flip-flops, memory structures, routing resources, and other internal components of the FPGA. The configuration data stored in the PROM is, therefore, a binary representation of the design of the FPGA hardware.

If the configuration data is copied from a PROM and written into another PROM, the entire FPGA design has been transferred or replicated. In many electronic systems it is desirable to prevent this copying or replication. An electronic system may be of a classified nature and the Government desires to keep the details of the design secret. In non-government applications the commercial electronics design may represent Intellectual Property and significant investment. Compromise or copying of this commercial design would result in loss of profits and failure to recoup research and investment costs. Because of examples like these, it is desirable to sanitize the configuration device (PROM) automatically, thoroughly, quickly, and in a manner that leaves no evidence of the sanitation process.

This present invention provides a system to automatically sanitize an FPGA PROM when an unauthorized access, tampering, or compromise is detected or indicated by some input (or indicated by a signal from a tamper-detection system).

SUMMARY OF THE INVENTION

It is, therefore, an object of the present invention to provide a self-modifying FPGA system. The FPGA system includes an FPGA and a configuration memory device coupled to the FPGA for providing the FPGA with configuration information. The configuration memory device is programmed with configuration data and dormant data. The FPGA system is also provided with a configuration assist circuit coupled to the FPGA and the configuration memory device for controlling loading of configuration information from the configuration memory device to the FPGA. A tamper detection system provides a tamper signal to the FPGA, wherein when a tamper signal is received by the FPGA the configuration data is replaced with the dormant data.

It is also an object of the present invention to provide an FPGA system wherein the FPGA is a SRAM based FPGA.

It is also another object of the present invention to provide an FPGA system wherein the configuration memory device is a PROM.

It is also a further object of the present invention to provide an FPGA system wherein the PROM is a FLASH based PROM.

It is still another object of the present invention to provide an FPGA system wherein the FPGA includes a configuration block in communication with a configuration assist circuitry to assist in rewriting configuration data from the configuration memory device.

It is yet another object of the present invention to provide an FPGA system wherein the configuration assist circuitry includes a mechanism for initiating a reload of the dormant data from the configuration memory device to the FPGA amounting to reconfiguration of the FPGA upon receipt of a tamper signal.

It is a further object present invention to provide an FPGA system wherein the configuration memory device is further provided with null data.

It is also an object of the present invention to provide an FPGA system wherein the configuration memory device is further provided with a first set of dormant data and a second set of dormant data.

It is also another object of the present invention to provide an FPGA system wherein the configuration data is located beginning at a zero address of the configuration memory device and the FPGA system includes a mechanism for transferring the dormant data to the zero address upon the initiation of tamper signal.

It is also a further object of the present invention to provide an FPGA system wherein the mechanism for transferring includes a mechanism for clearing or over writing the configuration data with null data, reading the dormant data and writing the dormant data to the zero address.

Other objects and advantages of the present invention will become apparent from the following detailed description when viewed in conjunction with the accompanying drawings, which set forth certain embodiments of the invention.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

Referring to FIGS. 1, 2, 3 and 4 the present FPGA system 100 is shown in various configurations. The various configurations are substantially identical with the exception of the utilization of the dormant data 230, configuration data 210 and/or null data 220 within the configuration memory device 102. In general, the FPGA system 100 includes an FPGA 101, and a configuration memory device 102 coupled to the FPGA 101 for providing the FPGA 101 with configuration information, wherein the configuration memory device 102 is programmed with configuration data 210, dormant data 230 and/ or null data 220. The FPGA system also includes a configuration assist circuit 106 coupled to the FPGA 101 and the configuration memory device 102 for controlling loading of configuration information from the configuration memory device 102 to the FPGA 101. A tamper detection system 310 is further provided. The tamper detection system 310 provides a tamper indication signal 300 to the FPGA 101, wherein when a tamper indication signal is received by the FPGA 101 the configuration data 210 is replaced with the dormant data 230.

The present invention provides for the implementation of anti-tamper, self-modifying electronic systems employing a self-modifying FPGA 101 for various applications requiring anti-tamper capabilities. The present invention provides a mechanism for sanitizing an FPGA and FPGA configuration devices by providing a self-modification feature removing sensitive information in the event of tampering. The present invention also provides a mechanism for combating (or hindering) reverse engineering in FPGAs. The present invention further provides a mechanism for protecting critical design information in FPGA applications.

These goals are achieved by providing the present FPGA system 100 to automatically sanitize an FPGA 101 and configuration memory device (for example, a PROM) 102 when an unauthorized access, tampering, or compromise is detected or indicated by some input (or indicated by a signal from a tamper detection system). The present FPGA system 100 sanitizes the configuration memory device 102 (that is, PROM) quickly and thoroughly without leaving evidence of the sanitation. The sanitation process is further enhanced by the capability of the present FPGA system 100 to write new configuration information into the configuration memory device 102 so that the FPGA 101 exhibits functionality other than the originally intended purpose. This new configuration information serves to mislead the person attempting to tamper with the FPGA 101 by implying that the post-sanitation design represents the complete functionality of the electronic device or system.

In accordance with a preferred embodiment of the present invention, the present FPGA system 100 described herein is implemented using FPGAs manufactured by Altera Corporation of San Jose, Calif. Although FPGAs from Altera Corporation are employed in accordance with a preferred embodiment of the present invention, those skilled in the art will appreciate the concepts of the present invention are applicable to any electronic system using SRAM based FPGAs and particularly SRAM based FPGAs with non-volatile configuration memory devices (PROM, EEPROM, FLASH Memory, or other).

In accordance with a preferred embodiment the FPGA 101 is a SRAM based FPGA. The SRAM based FPGA is a Programmable Logic Device (PLD) that utilizes SRAM cells to hold configuration information. This configuration information (that is, and as will be discussed below in greater detail the original configuration data 210 used for proper operation of the electronic system or the dormant data 230 used in the event of a tamper indication signal so as to trick the unauthorized user into believing no modification of the FPGA system has taken place) determines the operation of every component of the FPGA: logic cells, sequential logic devices (flip flops), memory arrays, routing resources that connect the various functional units, and Input/Output (I/O) features such as drive capacity, interface specifications (CMOS (complementary metal-oxide semiconductor), TTL (transistor-transistor logic), LVDS (low voltage data signal), LVPECL (low voltage positive emitter coupled logic), and others), data direction (input, output, bidirectional).

These SRAM data bits are volatile, that is, they lose the data when the device loses power. When the FPGA 101 is powered without configuration data, it is a useless device. Therefore, the SRAM based FPGA 101 is usually paired with a non-volatile configuration memory device 102 (for example, PROM, EEPROM, FLASH, or other). When the FPGA 101 is powered, dedicated circuitry loads the configuration data from the configuration memory device 102 causing the FPGA 101 to become a useful device.

The FPGA may be configured by serial or parallel data and may be connected to either serial or parallel configuration memory devices. In accordance with a preferred embodiment, the FPGA 101 is configured using serial configuration devices. However, the use of parallel data bus and parallel configuration devices are specifically anticipated and the techniques described in accordance with the implementation of the present FPGA system are identical whether a serial or parallel configuration scheme is used.

Figure 1:
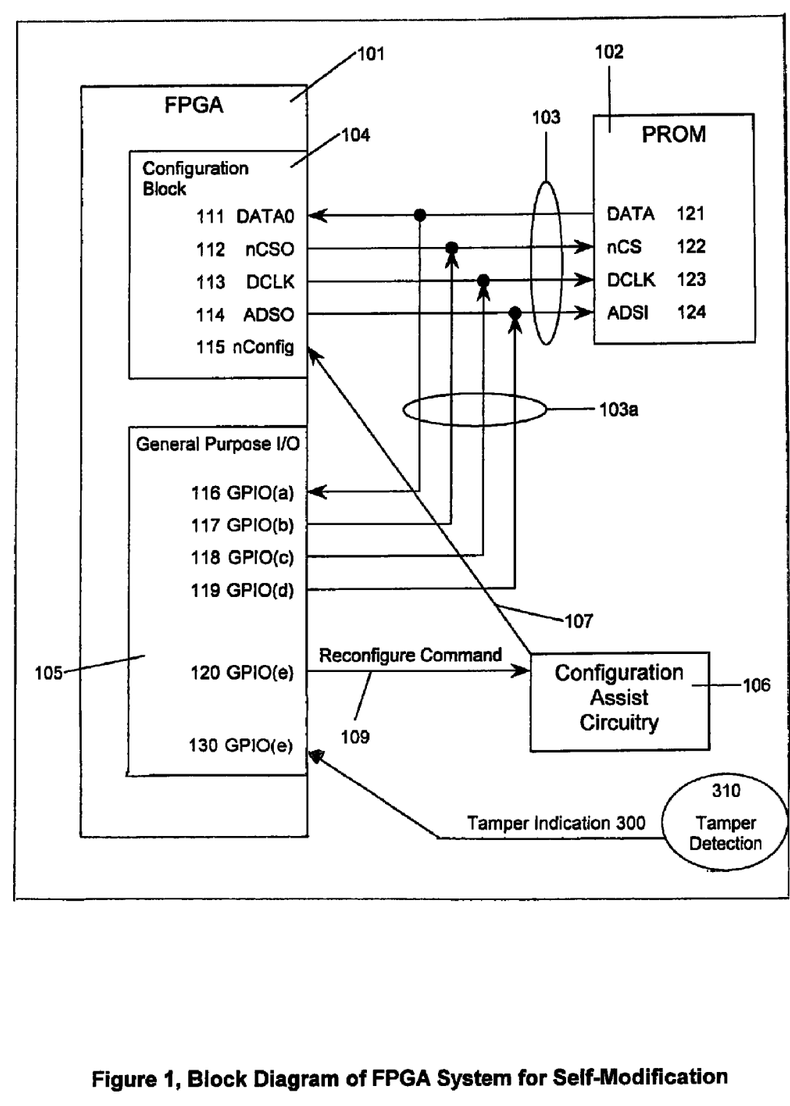
FIG. 1 is a block diagram of an FPGA system for self-modification in accordance with the present invention.

In accordance with a preferred embodiment and with reference to FIG. 1, the present self-modifying FPGA system 100 for anti-tamper applications is comprised of an SRAM based FPGA 101, a FLASH based PROM configuration memory device 102 (EEPROM may also be used), configuration assist circuitry 106, and typical support components such as power supplies and oscillator or clock device (not shown).

In accordance with a preferred embodiment of the FPGA system 100, Data input (DATA0 pin 111 and ADSO pin 114), clock output (DCLK pin 113), and chip select signal output (nCSO pin 112) of the configuration block 104 of the FPGA 101 are respectively connected to Data output (DATA pin 121 and ADSI pin 124), clock input (DCLK pin 123) and chip select input (nCS pin 122) of the configuration memory device (or PROM) 102 by conductors (or configuration data bus) 103. These conductors may be PCB (printed circuit board) traces, wire bonds directly to the silicon dies of the two components, conductors internal to an IC (integrated circuit) if the PROM and FPGA are part of the same piece of silicon, or any other suitable connectivity method. Additional General Purpose I/O pins 116, 117, 118, 119 in the FPGA's General Purpose I/O 105 is also connected to these configuration signals by conductors (or configuration data bus) 103a. As those skilled in the art will certainly appreciate, the FPGA 101 will traditionally include a great deal more GPIO (general purpose input/output) and general purpose circuitry beyond what is used to implement the self-modifying functions of the present invention and such circuitry is not shown herein, although it will be appreciated by those skilled in the art how such circuitry is employed in conjunction with normal operation of the FPGA.

The configuration assist circuitry 106 connects to a general purpose I/O pin 120 of the GPIO 105 and to the FPGA's nConfig pin 115 of the configuration block 104 via respective conductors 109, 107.

In normal operation, the FPGA's configuration block 104 accesses the PROM 102 at power-up. The FPGA 101 supplies the data clock (DCLK pin 113), chip select (nCSO pin 112), and data output (ADSO pin 114) signals to the PROM 102. In response, the PROM, that is, the configuration memory device, 102 provides the configuration information (in the event of a normal operation, the configuration data 210) to the DATA0 pin 111.

This configuration operation (or process) occurs every time the FPGA 101 is powered or whenever the nConfig pin 115 is asserted (that is, pulled low since this is an active low input).

In the case that a self-modification is required, the FPGA 101 uses general purpose I/O pins 116, 117, 118, 119 to rewrite the PROM 102, write new data to the PROM 102, or re-arrange data in the PROM 102. When not in use by the FPGA 101 for configuration, the configuration pins 111, 113, 114 are placed in a high impedance state. Configuration pins nCSO pin 112 and nConfig pin 115 are open collector pins that are pulled high by a resistor (not shown) so that they may be asserted by being pulled low by any attached device.

Once the PROM data has been changed, the FPGA 101 asserts a "reconfigure command" output 109 on General Purpose I/O pin 120 to the configuration assist circuitry 106. Upon receiving the "reconfigure command" signal from the FPGA 101 via conductor 109, the configuration assist circuitry 106 asserts the nConfig pin 115 signal low (on conductor 107) for the appropriate amount of time to force a reload of new data from the PROM 102 to the FPGA 101. This reloading of new configuration information amounts to a reconfiguration of the FPGA 101.

The configuration assist circuitry 106 is required to guarantee that the signal applied to the nConfig pin 115 is held low for the appropriate amount of time to force a reconfiguration. Because of the programmable nature of the FPGA 101, as soon as the nConfig pin 115 is forced low, all of the general purpose I/O pins 115, 116, 117, 118, 119, 120 become high impedance pins unable to drive any signals. The configuration assist circuitry 106 requires only a very brief reconfigure command input 109 and then holds the signal applied to the nConfig pin 115 low for the appropriate amount of time. In accordance with a preferred embodiment, the configuration assist circuitry 106 has been implemented by using digital circuitry, simple Resistor/Capacitor (RC) circuits, and using transistor based circuits. The implementation of this portion of the design may be carried out in any number of ways to ensure that nConfig pin 115 remains low for the appropriate amount of time.

Figure 2:
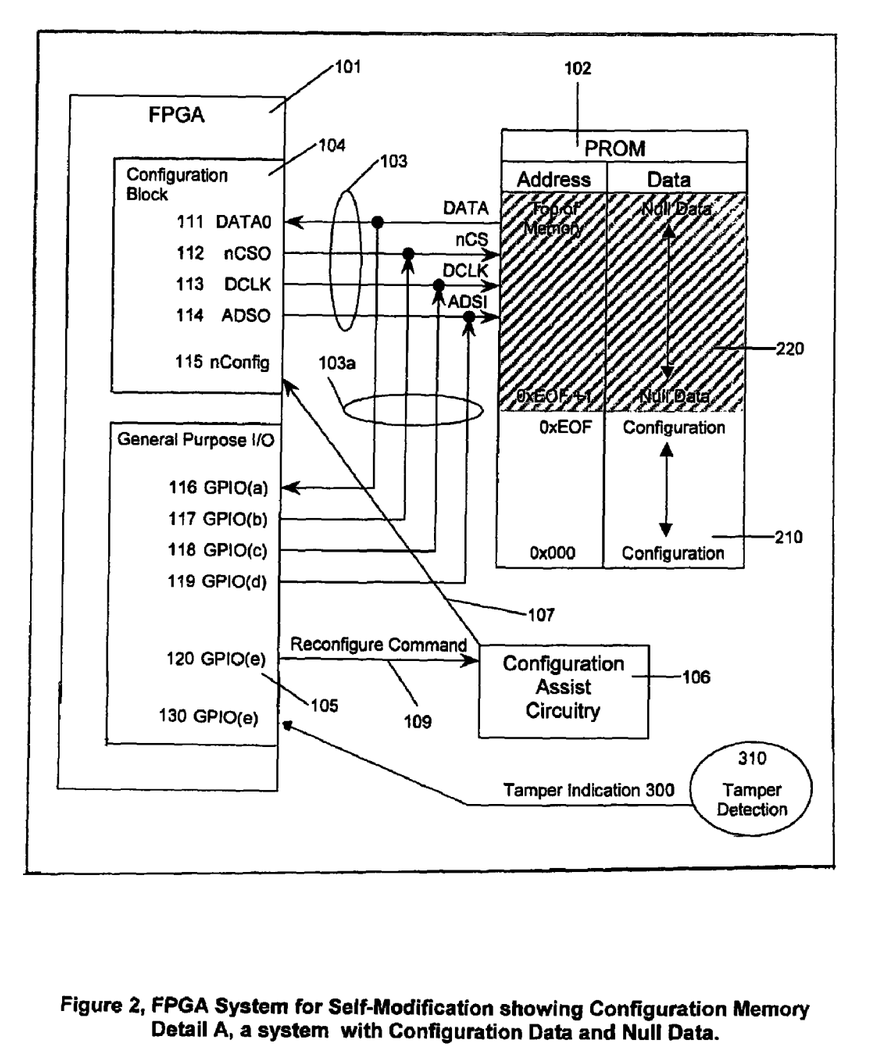
FIG. 2 is a block diagram of the FPGA system, prior to a tamper indication and self modification, in accordance with the present invention showing configuration memory detail A, that is, an FPGA system with configuration data and null data (and the dormant data not shown).

The arrangement and storage of information in the configuration memory device (that is, PROM) 102 is important in the implementation of the present self-modifying FPGA system 100. In accordance with a preferred implementation of the present FPGA system 100 as shown in FIG. 2 the PROM 102 contains configuration data 210 for the FPGA 101 starting at address 0x000 extending to some address sufficient to hold all of the necessary configuration information (0xEOF in this example denotes the address with the last bit of configuration, or End Of File data). The addresses from 0x000 to 0xEOF which contain the configuration information are also referred to as the configuration position, that is, the memory location from which the FPGA 101 reads its configuration information. From the next address (0xEOF+1) to the end of memory (or Top Of Memory) the remaining addresses in the PROM 102 are typically filled with null data 220.

A configuration operation occurs when the FPGA 101 is powered or if the nConfig input 115 is pulled low by the configuration assist circuitry 106, for example, based upon the issuance of a tamper indication signal 300 by the tamper detection system 310 (as discussed below in greater detail). During a configuration operation, the FPGA 101 automatically reads the configuration data 210 (or other configuration information, such as, dormant data 230 as discussed below in greater detail) from the PROM 102 using the configuration data bus 103.

As briefly mentioned above, because of the sizes of PROMs available and also the availability of configuration information compression, the PROMs memory cells are not completely filled with configuration information, but also contain null data 220 to fill out the rest of the configuration memory device 102. This null data 220 may be all logical "1", all logical "0", or some null pattern.

Figure 3:
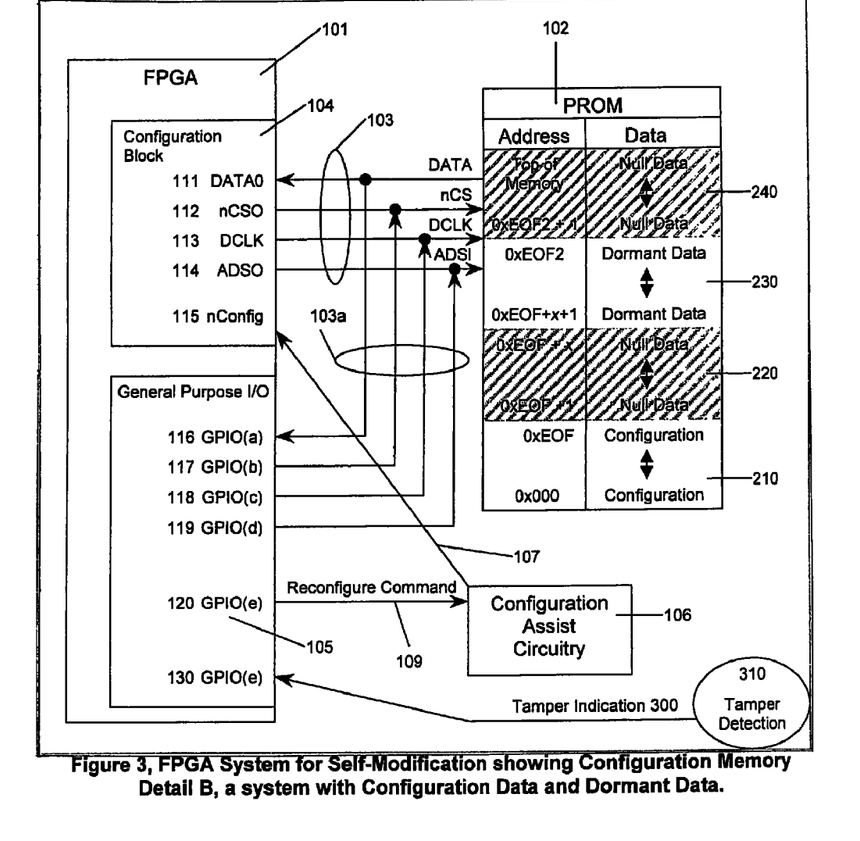
FIG. 3 is a block diagram of the FPGA system, prior to a tamper indication and self-modification, in accordance with the present invention showing configuration memory detail B, that is, an FPGA system with configuration data and dormant data.
Figure 3A:
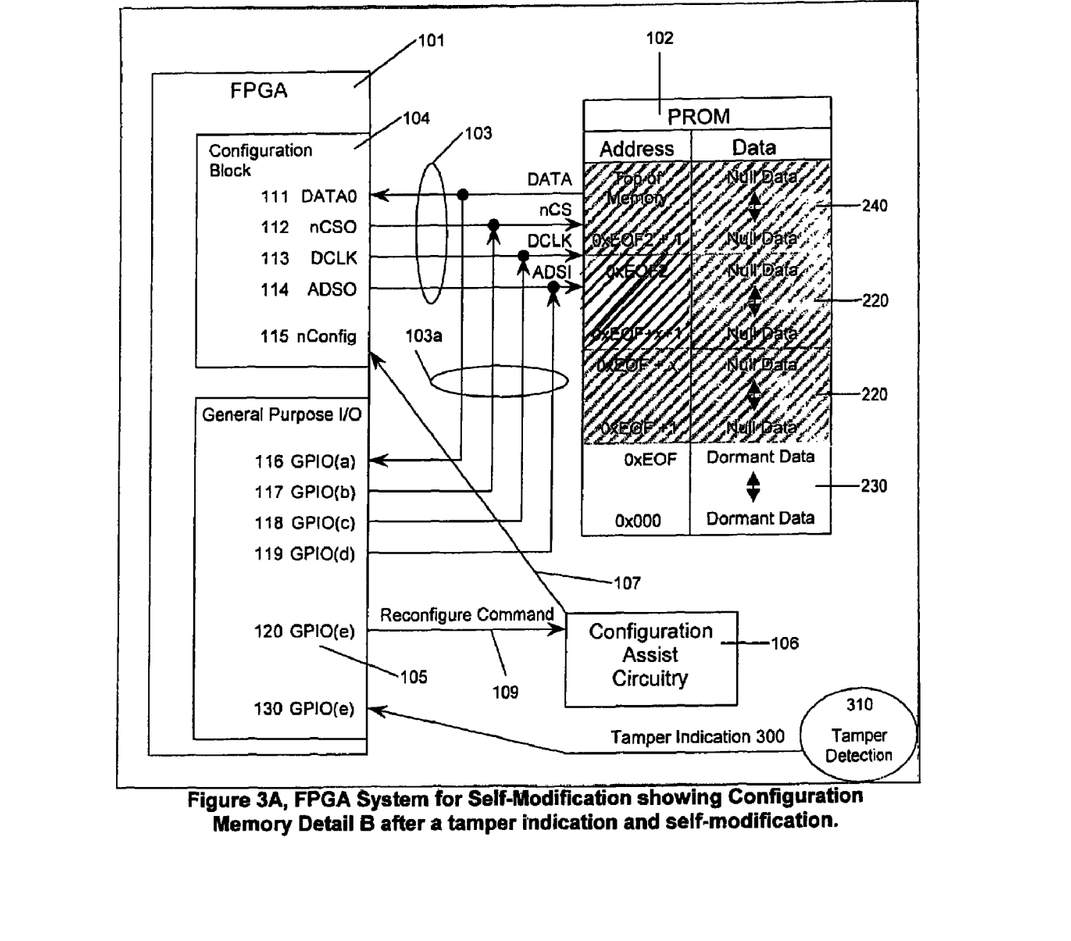
FIG. 3A is a block diagram of the FPGA system in accordance with the present invention showing configuration memory detail B after a tamper indication and a self-modification.

FIG. 2 illustrates normal FPGA configuration data 210 (that is, intended configuration information for proper operation and not the dormant data placed in the configuration position upon the occurrence of a tamper indication) in the configuration position (as discussed below in greater detail) and null data 220 prior to a tamper indication signal 300 and self-modification. FIG. 3 depicts the FPGA configuration data 210 in the present anti-tamper FPGA system 100 as designed and configured for tamper protection in accordance with an implementation of the present invention. FIG. 3A shows the present FPGA system 100 after a tamper indication signal 300 and self-modification as discussed herein in greater detail.

As shown in FIG. 3, the configuration memory device, that is, PROM, 102 is configured for anti-tamper, self-modifying applications and contains configuration data 210 located beginning at the zero address (that is, 0x000), that is, the configuration position. There is a second set of configuration information referred to as dormant data 230. The dormant data 230 is actually a valid set of configuration information, but is not located beginning at the zero address (or configuration position) and, therefore, is not loaded by the FPGA 101 during a configuration operation.

In anti-tamper, self-modifying applications in accordance with the operation of the present FPGA system 100, the FPGA 101 includes some input that indicates that a tamper event has occurred (for example, tamper indication signal 300 as provided by a tamper detection system 310). Those skilled in the art will appreciate the various possibilities of operation of the tamper indication signal 300 which may be utilized within the spirit of the present invention. As far as the present invention is concerned, some tamper detection device or system 310 exists to detect that a tamper has occurred or is being attempted.

In accordance with a preferred embodiment of the present invention, the tamper detection system 310 is a sensor that identifies 1) a change in radiation (indicates the system is being x-rayed); (2) a change in pressure or gaseous content (indicates that an atmospheric seal has been broken); (3) change in a simple switch condition (indicates that an operator has pressed the panic button or that a tamper switch has been triggered). Mercury switches can be used to indicate that a system is being tampered with. More elaborate systems include continuity loops to indicate that a system is still properly assembled or time-based access to indicate that it is the proper time for the device to be used (like the clock control on a bank vault that prohibits the vault being opened before 8:00 AM or after 5:00 PM). In military aircraft, the tamper (or self-destruct) signal is activated when the pilot ejects. In secure computing equipment, the self-destruct is triggered by repeatedly entering an incorrect (invalid) password/user combination.

The tamper detection system 310 provides a tamper indication signal 300 to the FPGA 101 to indicate that a tamper event has occurred or is occurring. This input may be implemented in a number of ways and may indicate numerous types of events. The tamper detection system 310 may even be internal to the FPGA 101. In accordance with a preferred embodiment, most of the tamper detection system 310 is implemented in the FPGA 101.

When the tamper detection system 310 asserts the tamper indication signal 300 to the FPGA 101, the FPGA 101 transfers the dormant data 230 into the configuration position beginning at address zero (see FIG. 3A). This process is performed in the following manner:

(1) The FPGA 101 drives the configuration data bus 103*a* using general purpose I/O pins 116, 117, 118, 119 to clear or over write (with null data) the configuration data 210 located at address 0x000 to 0xEOF.

(2) The FPGA 101 drives the configuration data bus 103*a* using general purpose I/O pins 116, 117, 118, 119 to read the dormant data 230 (from 0xEOF+x+1 to 0xEOF2) and write the dormant data 230 to the memory location beginning at address 0x000. It is contemplated the End of File location (0xEOF) may be different due to the implementation of data compression algorithms.

(3) Depending on the specific application, the FPGA 101 may erase or overwrite the Dormant Data 230 in the original memory location (for example, with null data 220 as shown in FIG. 3A).

(4) Using GPIO pin 120 the FPGA 101 asserts the reconfigure command to the configuration assist circuitry 106 via conductor 109.

(5) The configuration assist circuitry 106 asserts nConfig pin 115 via conductor 107 (that is, nConfig pin 115 is pulled low) for the appropriate length of time to force the FPGA 101 into configuration operation.

(6) The FPGA 101 performs the Configuration Operation by using the configuration data bus 103 to read the Dormant Data 220 now starting at address 0x000 from the PROM 102.

Figure 4:
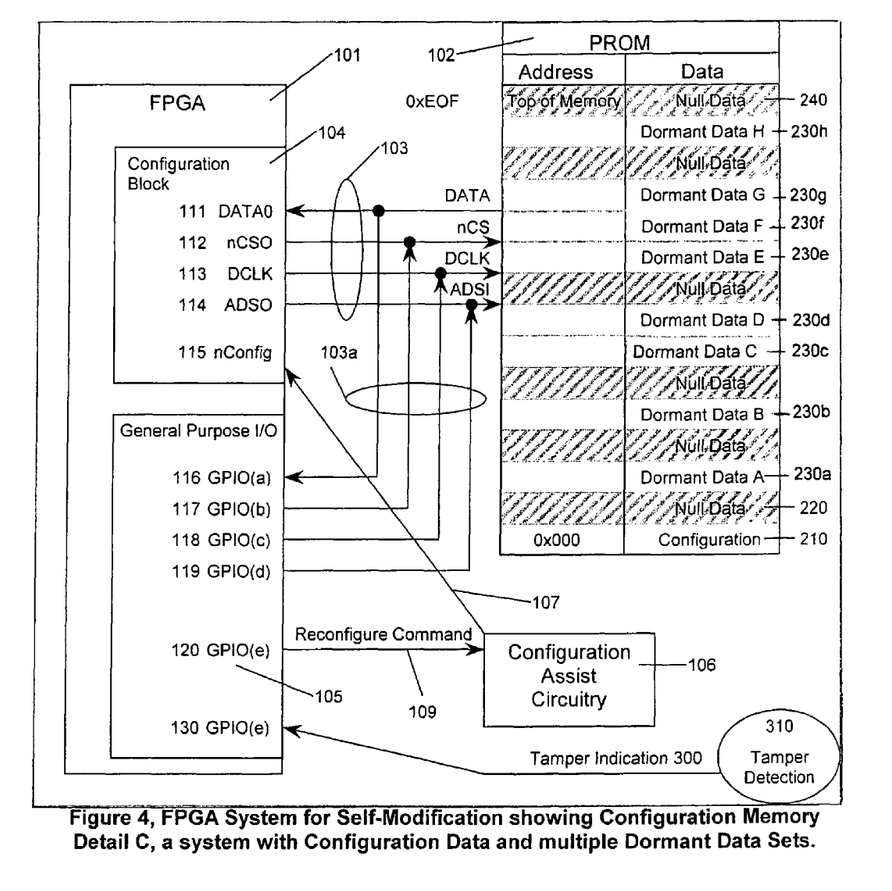
FIG. 4 is a block diagram of FPGA system, prior to a tamper indication and self-modification, in accordance with the present invention showing configuration memory detail A, that is, an FPGA system with configuration data and multiple dormant data sets.

In accordance with preferred embodiments of the present invention, the PROM 102 may contain numerous dormant data sets 230*a-h* (see FIG. 4). The dormant data sets 230*a-h* allow the FPGA 101 numerous reconfiguration options. Circuitry may exist in the FPGA 101 that allows certain control inputs to determine which dormant data set is transferred to the configuration position. Alternately, each dormant data set may determine which dormant data will be next transferred into the configuration position.

It is contemplated that it is not necessary that the configuration data and dormant data sets be separated by null data. In practical application, the last bit of one data set can be followed by the first bit of the next data set. A preferred embodiment does use null data as separation between the data sets. This is an advantage because in development one can read in the data and "see" the null data pattern. As a result, they will be able to confirm where valid data begins and ends. In addition, there is also a date integrity advantage; a process can be designed to check for the null data pattern and that process used to confirm the end of the configuration data. Since the configuration data can be differing lengths (based on compression variables) it may be advantageous to be able to confirm the end of data in some applications. Further, there is a technicality in working with Flash devices and EEPROMs. Often, to erase these devices you must erase in blocks or sectors of various sizes. As an example, the M25P32 for ST Micro is a 32 Mbit device with the ability to erase 512 Kbit pages. That is, there are 64 sectors that can be individually erased. It is practical to separate the configuration data files, whether the main configuration, or dormant files, so that only one file is erased from memory at a time. Because compressed files may be of different lengths, placing all of the configuration data within a boundary of known limits allows the system to guarantee that at least all of the required data has been moved (transferred). Moving extra data is not a problem, not moving enough data is a problem because the FPGA will not complete the configuration cycle if data is not left out. There is an advantage to placing files with no null data in between. In some applications, packing the data as close as possible allows you to fit more data into a configuration memory device.

It is contemplated in accordance with an embodiment employing multiple dormant data sets, and with reference to FIG. 4, that the present FPGA system 100 can be implemented in which the FPGA 101 moves dormant data A 230*a* to the configuration position when a first tamper event is indicated by the tamper detection system 310 via the tamper indication signal 300. Following the transfer of dormant data A 230*a* to the configuration position, the FPGA 101 configures itself. Part of this new configuration information is instructions on which dormant data set will be transferred next. When the next tamper event occurs, the FPGA 101 transfers dormant data B 230*b* to the configuration position. This process can continue the same number of times as the number of dormant data sets.

Referring to FIG. 4, a self-modifying FPGA system 100 is also disclosed that includes 2 (or more) dormant data sets; dormant data A 230*a* and dormant data B 230*b* (and others as shown). When a tamper event is indicated by the tamper detection system 310 via the tamper indication signal 300 the FGPA 101 transfers dormant data A 230*a* into the configuration position and reconfigures as described in the preceding sections except that dormant data A 230*a* is not erased from its original location. After the configuration operation is complete, the FPGA configuration based on dormant data A 230*a* transfers dormant data B 230*b* to the configuration position without erasing the original dormant data B 230*b* from the dormant location. At this point, transferring the dormant data set may be automatic or may wait for a tamper indication input. Once dormant data B 230*b* has been transferred to the configuration position, the FPGA 101 outputs the configuration command (via conductor 109) to force the next configuration operation cycle. When the FPGA 101 commences operation with the configuration dictated by dormant data B 230*b*, the process of transferring dormant data A 230*a* into the configuration position begins again (either automatically or in response to an input).

This technique causes the FPGA 101 to eliminate the original FPGA configuration (and the primary functionality of the device) and to continuously cycle between two secondary configurations. This continuous cycling ensures that no residual data remains and adds a great deal of confusion to any effort to reverse engineer the system. If power is removed from the system, when power is reapplied to the system, the FPGA 101 will continuously cycle between the two configurations provided by dormant data A 230*a* and dormant data B 230*b* based either on automatic command or input, which ever was implemented in the FPGA designs represented in the dormant data configuration files. This system can be implemented with any number of dormant data sets limited only by the memory size of the configuration memory device 102.

It is contemplated the present self-modifying FPGA system 100 may be used in a variety of environments. In particular, the present self-modifying FPGA system 100, and underlying techniques, may be used to remotely change the operating characteristics (or features) of a product. Because the new functionality of the FPGA 101 is based on which dormant data set 230, 230*a-h* is transferred to the configuration position, the FPGA 101 can be directed to transfer a specific dormant data set 230, 230*a-h* based on specific requirements. The identification of the appropriate dormant data set 230, 230*a-h* is simply its address in configuration memory.

A system may be designed with a number of dormant data sets in the configuration memory device, each capable of configuring the FPGA with the ability to transfer dormant data and interface to the configuration assist circuitry. This multiple dormant data system is depicted in FIG. 4. Information can be passed to the FPGA 101 concerning which configuration is required next (based on the need for the specific features of the FPGA 101 when configured by that dormant data set). The FPGA 101 can then transfer the proper dormant data set 230*a-h* into the configuration position in configuration memory device 102 and invoke a configuration operation by asserting the reconfigure command to the configuration assist circuitry 106. By so doing, the FPGA 101 will reconfigure itself to handle the selected task.

It should be understood the PROM 102 in FIG. 4 contains many dormant data sets 230*a-h*. As example, some of the data sets are separated by Null Data, and some are not.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A self-modifying FPGA system, comprising:
   an FPGA;
   a configuration memory device coupled to the FPGA for providing the FPGA with configuration information, the configuration memory device programmed with configuration data and dormant data;
   configuration assist circuit coupled to the FPGA and the configuration memory device for controlling loading of configuration information from the configuration memory device to the FPGA;
   a tamper detection system providing a tamper indication signal to the FPGA, wherein when a tamper indication signal is received by the FPGA the configuration data is replaced with the dormant data and
   wherein the FPGA includes a configuration block in communication with a configuration assist circuitry to assist in rewriting configuration data from the configuration memory device.

2. The FPGA system according to claim 1, wherein the FPGA is a SRAM based FPGA.

3. The FPGA system according to claim 2, wherein the configuration memory device is a PROM.

4. The FPGA system according to claim 3, wherein the PROM is a FLASH based PROM.

5. The FPGA system according to claim 1, wherein the configuration memory device is a PROM.

6. The FPGA system according to claim 5, wherein the PROM is a FLASH based PROM.

7. The FPGA system according to claim 1, wherein the configuration assist circuitry includes means for initiating a reload of the dormant data from the configuration memory device to the FPGA amounting to reconfiguration of the FPGA upon receipt of a tamper indication signal.

8. The FPGA system according to claim 1, wherein the configuration memory device is further provided with null data.

9. The FPGA system according to claim 1, wherein the configuration memory device is further provided with a first set of dormant data and a second set of dormant data.

10. A self-modifying FPGA system, comprising:
    an FPGA;
    a configuration memory device coupled to the FPGA for providing the FPGA with configuration information the configuration memory device programmed with configuration data and dormant data;
    configuration assist circuit coupled to the FPGA and the configuration memory device for controlling loading of configuration information from the configuration memory device to the FPGA;
    a tamper detection system providing a tamper indication signal to the FPGA, wherein when a tamper indication signal is received by the FPGA the configuration data is replaced with the dormant data; and wherein the configuration data is located beginning at a zero address of the configuration memory device and the FPGA system includes means for transferring the dormant data to the zero address upon the initiation of tamper indication signal.

11. The FPGA system according to claim 10, wherein the means for transferring includes means for clearing or overwriting the configuration data with null data, reading the dormant data and writing the dormant data to the zero address.

12. The FPGA system according to claim 10, wherein the FPGA is a SRAM based FPGA.

13. The FPGA system according to claim 12, wherein the configuration memory device is a PROM.

14. The FPGA system according to claim 13, wherein the PROM is a FLASH based PROM.

15. The FPGA system according to claim 10, wherein the configuration memory device is a PROM.

16. The FPGA system according to claim 15, wherein the PROM is a FLASH based PROM.

17. The FPGA system according to claim 10, wherein the FPGA includes a configuration block in communication with a configuration assist circuitry to assist in rewriting configuration data from the configuration memory device.

18. The FPGA system according to claim 17, wherein the configuration assist circuitry includes means for initiating a reload of the dormant data from the configuration memory device to the FPGA amounting to reconfiguration of the FPGA upon receipt of a tamper indication signal.

19. The FPGA system according to claim 10, wherein the configuration memory device is further provided with null data.

20. The FPGA system according to claim 10, wherein the configuration memory device is further provided with a first set of dormant data and a second set of dormant data.

* * * * *